(12) United States Patent
Abbata et al.

(10) Patent No.: US 6,268,733 B1
(45) Date of Patent: Jul. 31, 2001

(54) FIELD SERVICE SYSTEM FOR ANALOG CURRENT ANALYSIS OF DIGITALLY CONTROLLED POWER DEVICES

(75) Inventors: Salvatore A. Abbata; Robert Lewandowski, both of Webster, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/411,577

(22) Filed: Oct. 4, 1999

(51) Int. Cl.[7] .............................. G01R 31/14; H04B 1/38; G06F 12/00
(52) U.S. Cl. ...................... 324/511; 375/222; 379/93.32; 714/25; 710/109
(58) Field of Search .............................. 324/511; 714/25; 710/109; 375/222; 379/93.32

(56) References Cited

U.S. PATENT DOCUMENTS

| | | | |
|---|---|---|---|
| 4,636,939 | * 1/1987 | Fildes | 710/109 |
| 5,357,519 | * 10/1994 | Martin et al. | 714/25 |
| 6,097,794 | * 2/1999 | Suffern et al. | 379/93.32 |

* cited by examiner

*Primary Examiner*—Glenn W. Brown
*Assistant Examiner*—Wasseem H. Hamdan
(74) *Attorney, Agent, or Firm*—John M. Kelly; David E. Henn

(57) ABSTRACT

A fault detection system for performing analog current analysis and diagnosis of power devices on digitally controlled buses. The fault detection system includes a field-installable bus interface having a current sensor on a ground return line. A bus controller connected to the bus interface then applies digital control signals and power to a system assembly via the bus interface such that individual power devices are selectively energized. A real time current profile of the selected power device over a selected period of time is determined. A fault determination network compares the real time current against a set of predetermined criteria and determines whether the selected power device is acceptable. The predetermined criteria beneficially includes information useful for determining degradation of the selected power device so that fault correction before failure is feasible.

19 Claims, 5 Drawing Sheets

* 24A-D = Exposure Stations

US 6,268,733 B1

FIELD SERVICE SYSTEM FOR ANALOG CURRENT ANALYSIS OF DIGITALLY CONTROLLED POWER DEVICES

FIELD OF THE INVENTION

This invention relates to analog current analysis of electromechanical components. More specifically, this invention relates to field service testing of digitally controlled electromechanical components using analog current analysis.

BACKGROUND OF THE INVENTION

Modern electrophotographic printers are complex machines that use a significant number of electromechanical devices, such as solenoids, electric motors, and relays to provide force responses. Such devices are subject to both mechanical and electrical degradation. Since low down time is critical, in the event of machine failure rapid diagnoses and repair of such printers is very important. Ideally, field service representatives would have an ability to anticipate problems so that corrective action could be taken before actual failure.

Diagnosing some electromechanical devices, in particular electric motors, using analog current signature analysis is well known. Such analysis is performed by monitoring the electrical current into a device being tested, comparing that current to a current baseline, and then determining whether the device being tested is acceptable. While beneficial, analog current signature analysis has been limited to situations where ready access is available to the device being tested.

Unfortunately, with most electrophotographic printers access to most electromechanical devices is severely limited. This precludes easy testing. Additionally, even when accessible, most electromechanical devices are not easily tested during operation since device power is applied only for short periods of time commanded by a microprocessor. Since an electromechanical device being tested might not be powered until a prior operation is performed by another electromechanical device that is controlled by another microprocessor, a very complex synchronization scheme might be required to simply test one electromechanical device.

Because of their complexity modern, high speed electrophotographic printers are often divided into discrete modules (subsystems) that intercommunicate with a master controller via a serial control bus. A typical bus might include a transmit line (Tx), a receive line (Rx), a clock line (Clk), a return line (Return) and a power line. The transmit, receive, clock, and return lines provide digital control while the power line and the return line provide power distribution.

Therefore, the ability to field-service test modular, digital-bus controlled electrophotographic printers using analog current analysis of power devices would be beneficial.

SUMMARY OF THE INVENTION

The principles of the present invention provide for field-service analog current analysis of electromechanical devices using a digital bus. A field-service instrument according to the principles of the present invention includes an interface to a digital control bus. That interface includes a current sensor for monitoring the current on a return line. The field-service instrument further includes a bus controller that applies digital control signals to the control bus via the interface. Those digital control signals cause electrical power to be applied to an electromechanical device being tested. A current monitor monitors the current drawn by the electromechanical device such that a current profile of that electromechanical device over a time is determined. The field-service instrument further includes a fault determination network that compares the current profile of the electromechanical device being tested with a baseline current profile. The fault determination network then determines whether the electromechanical device being tested is acceptable. Beneficially, the baseline current profile includes information useful for enabling the fault determination network to identify a degraded electromechanical device so that fault correction before actual failure is feasible.

BRIEF DESCRIPTION OF THE DRAWINGS

Other aspects of the present invention will become apparent as the following description proceeds and upon reference to.

DETAILED DESCRIPTION OF A PREFERRED EMBODIMENT OF THE INVENTION

Figure 1:
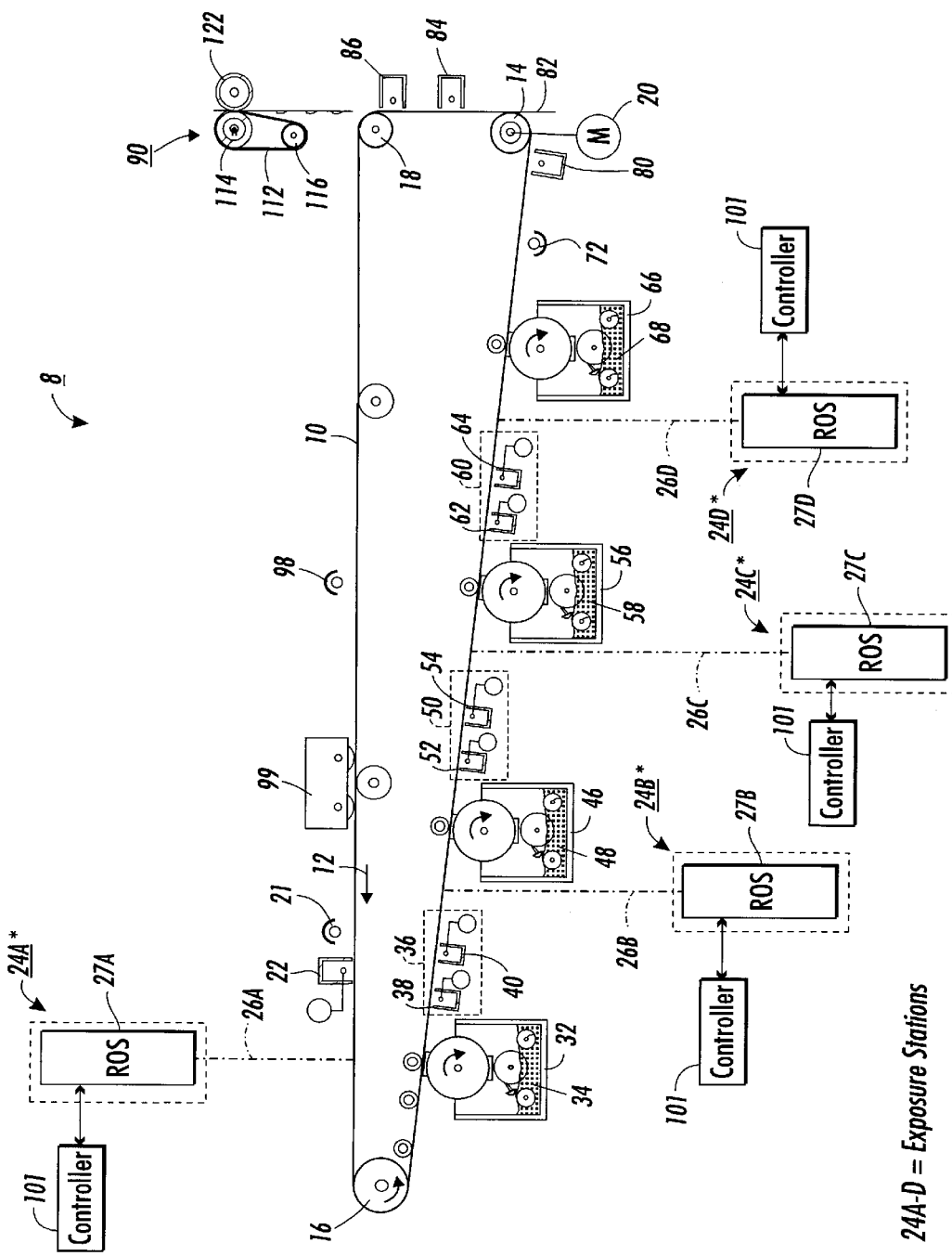
FIG. 1, which schematically illustrates an electrophotographic printing machine suitable for use with the principles of the present invention.

FIG. 1 illustrates an electrophotographic printing machine 8 that reproduces an original document. Although field-service instruments according to the principles of the present invention are well suited for use with the electrophotographic printing machine 8, such field-service instruments are also well suited for use with other machines. Therefore it should be understood that the present invention is not limited to testing the particular embodiment illustrated in FIG. 1.

The electrophotographic printer 8 is a color electrophotographic, multipass, Recharge-Expose-and-Develop (REaD), Image-on-Image (IOI) printer. That machine includes an Active Matrix (AMAT) photoreceptor belt 10 that travels in the direction 12. Belt travel is brought about by mounting the photoreceptor belt about a driven roller 14 and about tension rollers 16 and 18, and then driving the driven roller 14 using a motor 20.

As the photoreceptor belt travels each part of it passes through each of the subsequently described process stations. For convenience, a single section of the photoreceptor belt, referred to as the image area, is identified. The image area is that part of the photoreceptor belt which is to receive the various actions and toner layers that produce the final composite color image. While the photoreceptor belt may have numerous image areas, since each image area is processed in the same way a description of the processing of one image area suffices to explain the operation of the printing machine 8.

The imaging process begins with the image area passing a "precharge" erase lamp 21 that illuminates the image area so as to cause any residual charge which might exist on the image area to be discharged. Such erase lamps are common in high quality systems and their use for initial erasure is well known.

As the photoreceptor belt continues its travel the image area passes a charging station comprised of a DC corotron 22. The DC corotron charges the image area in preparation for exposure to create a latent image for black toner. For example, the DC corotron might charge the image area to a substantially uniform potential of about −500 volts. It should be understood that the actual charge placed on the photoreceptor will depend upon many variables, such as the black toner mass that is to be developed and the settings of the black development station (see below).

After passing the charging station the image area advances to an exposure station 24A. At the exposure station the charged image area is exposed to a modulated laser beam 26A from a raster output scanner 27A that raster scans the image area such that an electrostatic latent representation of a black image is produced.

After passing the exposure station 24A the exposed image area with the black latent image passes a black development station 32 that advances black toner 34 onto the image area so as to develop a black toner image. Biasing is such as to effect discharged area development (DAD) of the lower (less negative) of the two voltage levels on the image area. The charged black toner 34 adheres to the exposed areas of the image area, thereby causing the voltage of the illuminated parts of the image area to be about −200 volts. The non-illuminated parts of the image area remain at about −500 volts.

After passing the black development station 32 the image area advances to a recharging station 36 comprised of a DC corotron 38 and an AC scorotron 40. The recharging station 36 recharges the image area and its black toner layer using a technique known as split recharging. Briefly, the DC corotron 38 overcharges the image area to a voltage level greater than that desired when the image area is recharged, while the AC scorotron 40 reduces that voltage level to that which is desired. Split recharging serves to substantially eliminate voltage differences between toned areas and untoned areas and to reduce the level of residual charge remaining on the previously toned areas.

The recharged image area with its black toner layer then advances to an exposure station 24B. There, a laser beam 26B from a raster output scanner 27B exposes the image area to produce an electrostatic latent representation of a yellow image. The now re-exposed image area then advances to a yellow development station 46 that deposits yellow toner 48 onto the image area. After passing the yellow development station the image area advances to a recharging station 50 where a DC scorotron 52 and an AC scorotron 54 split recharge the image area.

An exposure station 24C then exposes the recharged image area. A modulated laser beam 26C from a raster output scanner 27C then exposes the image area to produce an electrostatic latent representation of a magenta image. After passing the magenta exposure station the now re-exposed image area advances to a magenta development station 56 that deposits magenta toner 58 onto the image area. After passing the magenta development station the image area advances another recharging station 60 where a DC corotron 62 and an AC scorotron 64 split recharge the image area.

The recharged image area with its toner layers then advances to an exposure station 24D. There, a laser beam 26D from a raster output scanner 27D exposes the image area to produce an electrostatic latent representation of a cyan image. After passing the exposure station 24D the re-exposed image area advances past a cyan development station 66 that deposits cyan toner 68 onto the image area. At this time four colors of toner are on the image area, resulting in a composite color image. However, the composite color toner image is comprised of individual toner particles that have charge potentials that vary widely. Directly transferring such a composite toner image onto a substrate would result in a degraded final image. Therefore it is beneficial to prepare the composite color toner image for transfer.

To prepare for transfer a pretransfer erase lamp 72 discharges the image area to produce a relatively low charge level on the image area. The image area then passes a pretransfer DC scorotron 80 that performs a pre-transfer charging function. The image area continues to advance in the direction 12 past the driven roller 14. A substrate 82 is then placed over the image area using a sheet feeder (which is not shown). As the image area and substrate continue their travel they pass a transfer corotron 84 that applies positive ions onto the back of the substrate 82. Those ions attract the negatively charged toner particles onto the substrate. As the substrate continues its travel is passes a detack corotron 86. That corotron neutralizes some of the charge on the substrate to assist separation of the substrate from the photoreceptor 10. As the lip of the substrate 82 moves around the tension roller 18 the lip separates from the photoreceptor.

The substrate is then directed into a fuser 90 where a fuser belt 112 disposed between a heated fuser roller 114 and a pressure roller 122 create a nip through which the substrate 82 passes. The fuser also includes an idle roller 116. The combination of pressure and heat at the nip causes the composite color toner image to fuse into the substrate. After fusing, a chute, not shown, guides the substrate to a catch tray, also not shown, for removal by an operator.

After the substrate 82 separates from the photoreceptor belt 10 the image area continues its travel and passes a preclean erase lamp 98. That lamp neutralizes most of the charge remaining on the photoreceptor belt. After passing the preclean erase lamp the residual toner and/or debris on the photoreceptor is removed at a cleaning station 99. The image area then passes once again to the precharge erase lamp 21 and the start of another printing cycle.

Figure 2:
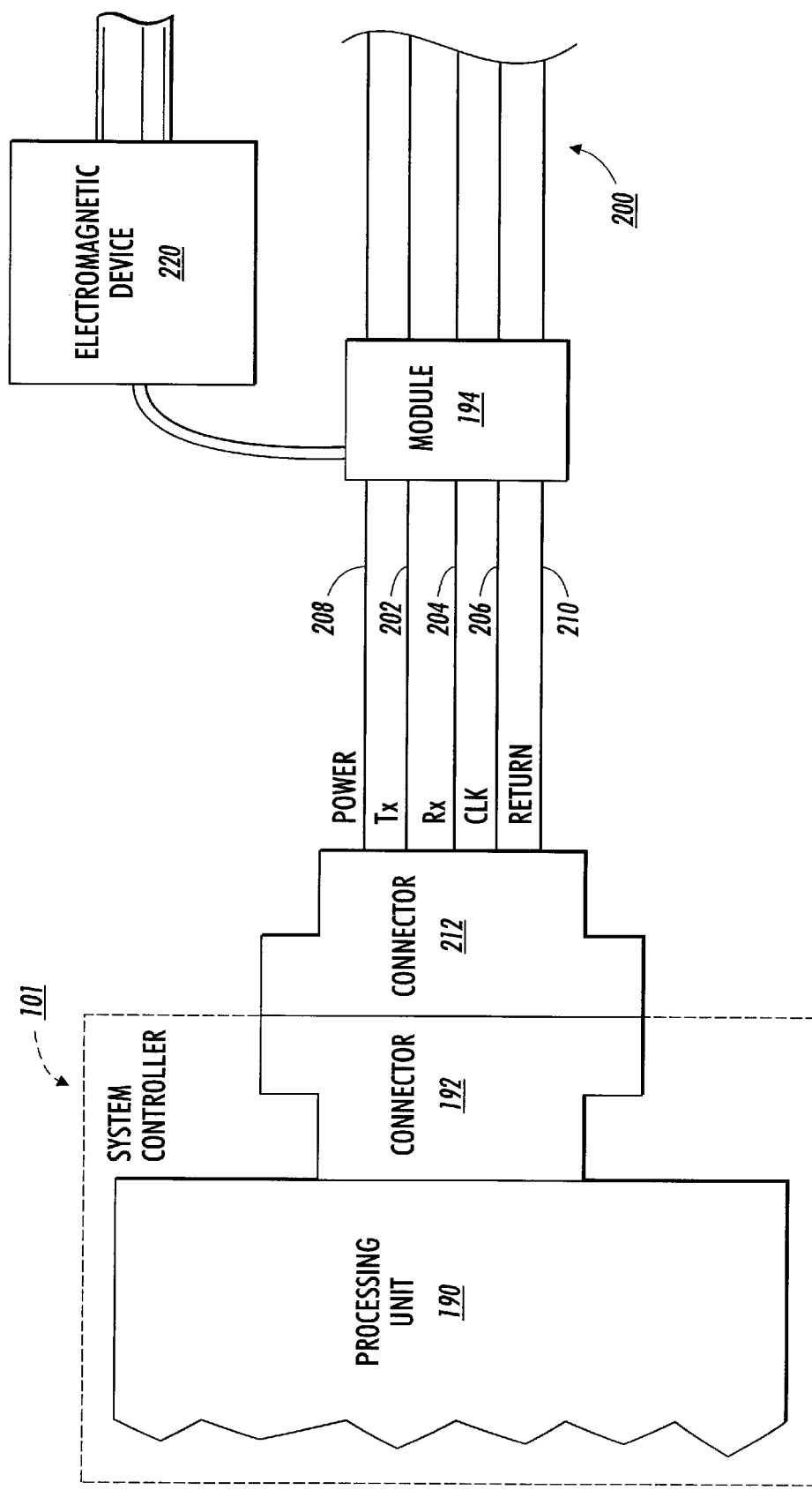
FIG. 2, which illustrates a bus used in the electrophotographic printing machine according to FIG. 1.

As can be seen from the foregoing, the electrophotographic printing machine 8 is a highly complex machine whose operation depends upon proper operation and timing of all of the machine's systems and sub-systems. The electrophotographic printing machine 8 includes numerous electromechanical power devices, including not only the motor 20, but also a motor inside each developer, a motor that drives the fuser, and numerous relays and solenoids in the various paper handlers, document feeders, and finishing stations that, while not specifically shown, are well-known to those skilled in the art. For example, FIG. 2 shows a solenoid 220. Such a solenoid might be used for feeding paper through the printing machine.

In addition to the elements described above, the printer 8 also includes a system controller 101 (shown in four places in FIG. 1) that controls the overall operation of the printer and that applies video information to the exposure stations. The system controller specifically includes a processing unit 190, reference FIGS. 2, 3, and 5. Turning now specifically to FIG. 2, the system controller 101 also includes a connector 192 that connects to the processing unit 190. Communication between the system controller 101 and the various systems and subsystems, represented by a generic module 194, is via a bus 200. The module represents a system that assists the enablement of one or more of the processing stations and/or steps discussed previously. The bus 200 is comprised of three digital signal lines, a Tx (transmit) line 202, an Rx (receive) line 204, and a Clk (clock) line 206; a power line 208; and a Return line 210. As shown, the bus 200 also includes an end connector 212 that mates with the connector 192.

In operation, the power line 208 supplies operating power, the three digital signal lines send and receive blocks of digital information, and the Return line acts as a ground. Using the Tx and Clk lines the processing unit 190 sends information to the module 194. That module decodes that information and causes a processing function to be performed according to preprogrammed operating instructions. Those programmed functions include energizing one or more electromechanical devices, such as the solenoid 220. Information is conveyed to the processing unit 190 via the Rx and Clk lines. Significantly, the power that drives the electromechanical power devices 220 comes from the power line 208 and returns via the Return line 210.

While the electrophotographic printing machine 8 described in relation to FIGS. 1 and 2 is beneficial, it is often difficult to isolate and/or identify faults in the electromechanical devices. This is particularly true when field servicing since the electrophotographic printing machine 8 is then either fully or almost fully assembled. It is also difficult to determine inherent latencies between digital control signals and actual operation of the electromechanical devices.

Figure 3:
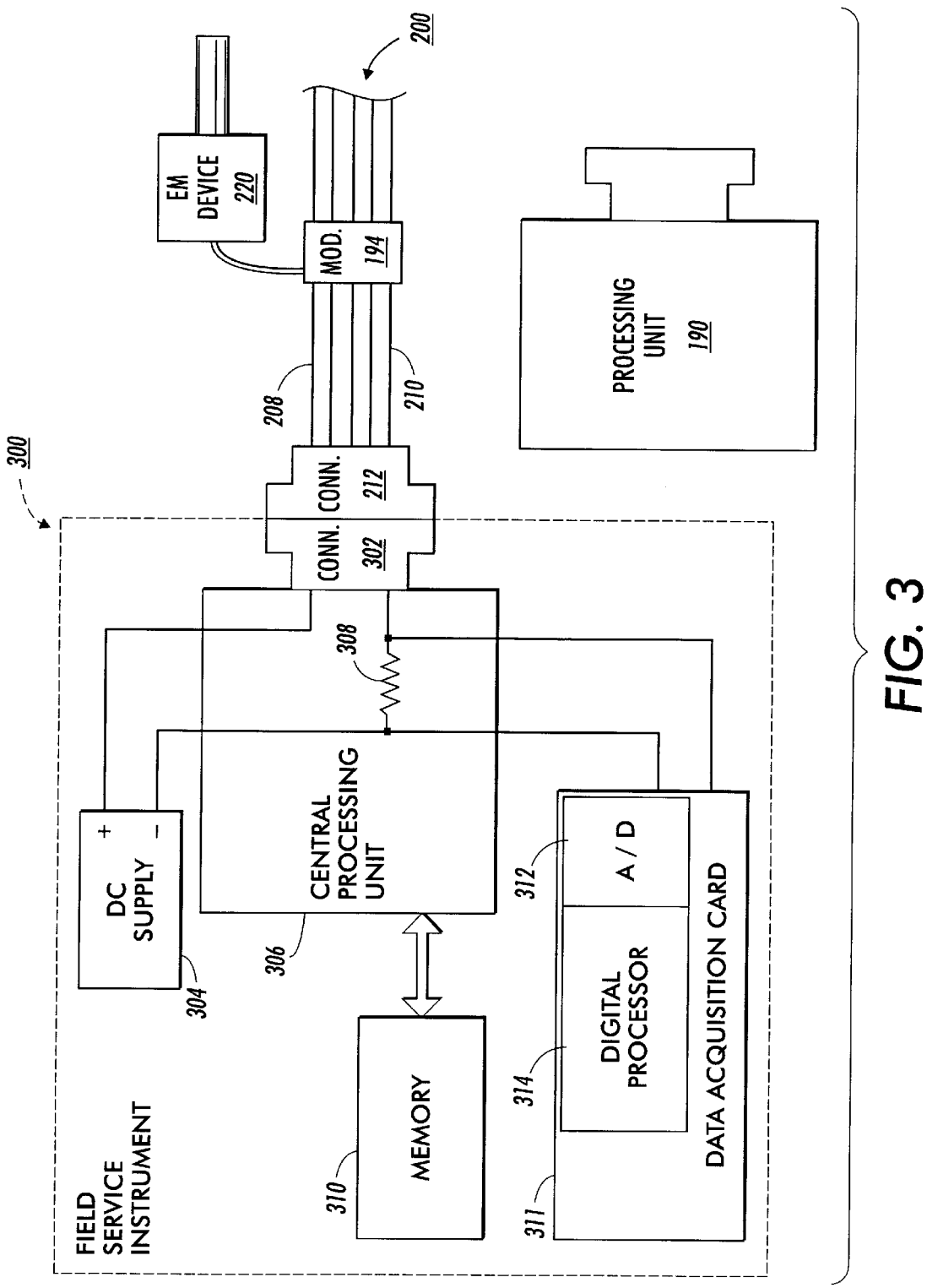
FIG. 3, which illustrates a field-service instrument having a return line current sensing resistor and that is connected to the electrophotographic printing machine of FIG. 1.

FIG. 3 illustrates a field service instrument 300 that tests the electromechanical devices using analog current signature analysis. To install the field service instrument 300 the end connector 212 is removed from the connector 192 and connected to a connector 302 of the field-service instrument. This isolates the processing unit 190 from the module 194. The field-test instrument 300 includes a power supply 304 that supplies applies electrical power between the power line 208 and the Return line 210. The field-test instrument 300 also includes a central processing unit 306 that communicates with the module 194 using the Tx line 202, the Rx line 204, and the Clk line 206 (reference FIG. 2). The field-test instrument 300 also includes a sensing resistor 308 in line with the Return line. The potential drop across the sensing resistor 308 is applied to a data acquisition card 311. A typical sensing resistor might be 0.01 ohms. The data acquisition card 311 includes an analog-to-digital converter 312 and a digital processor 314 that connects to the central processing unit. Also connected to the central processing unit 306 is a memory card 310.

In operation, as a preprogrammed response to an operator input, the central processing unit 306 send digital information to the module 194 that causes the module to turn on a selected electromechanical device, say the solenoid 220. That solenoid then begins drawing electrical current from the power supply 304. That electrical current causes an increased potential drop across the sensing resistor 308 that is applied to the A/D converter 312. The A/D converter 312 converts the increased potential drop into digital information that is processed and stored by the digital processor unit 314. The processed and stored information, which represents the analog current used by the solenoid 220, is then sent to the central processing unit 306. The central processing unit then recalls baseline information from the memory 310 and, using preprogrammed criteria, compares baseline information to the information from the digital processor unit 314. Based upon that comparison the central processing unit provides a field-service operator with diagnostic information about the electromechanical device, here the solenoid 220, being tested. Such diagnostic information might take the form of a good-bad alarm, a display that provides an "acceptable" current trace and the measured current trace of the electromechanical device 220 under test, or a numerical indication of the quality of the electromechanical device under test.

Figure 4:
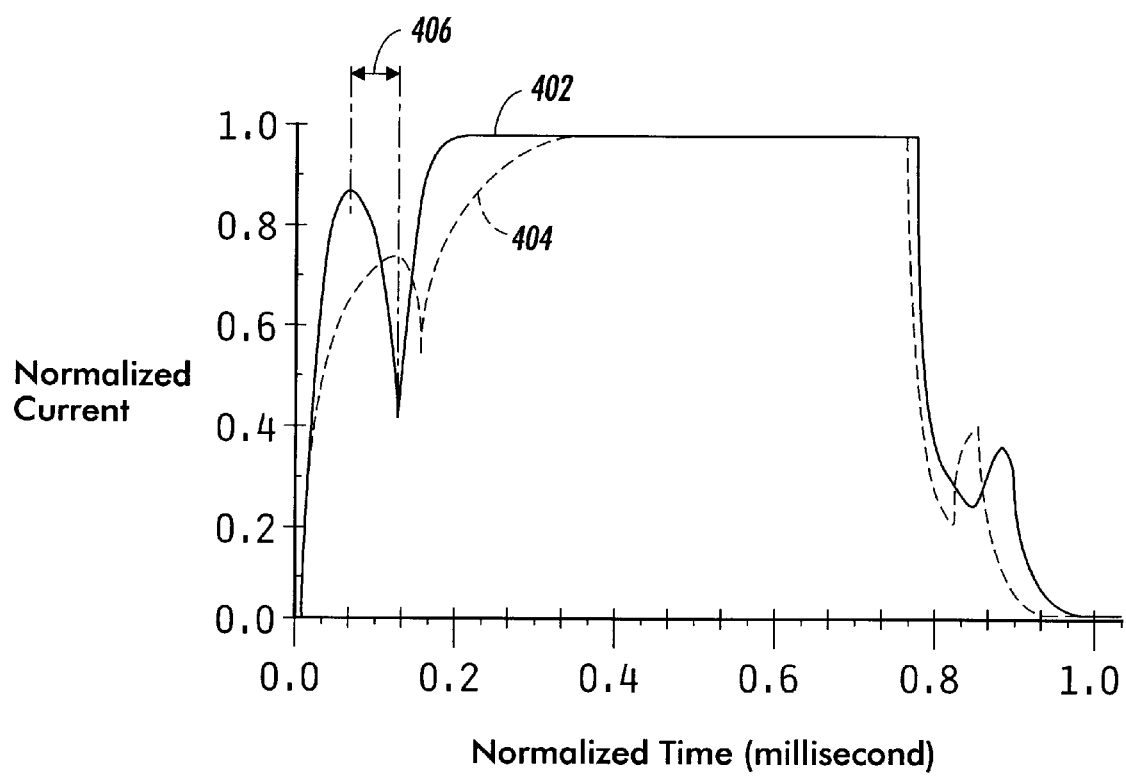
FIG. 4, which illustrates an exemplary analog current profiles for a solenoid.

FIG. 4 provides an example of measured and acceptable current traces for a solenoid 220. An acceptable waveform 402, which is beneficially normalized for a current of 1.0, might have been obtained from an average of many solenoids or from a manufacturer's specifications. During "turn-on" the current might increase rapidly and then, as the solenoid's armature begins moving, the current might drop off. Finally, as the armature reaches its maximum insertion the current might increase to a maximum. Then when power is removed, the inductive effect, combined with armature motion might cause a tailing off effect. Also provided in FIG. 4 is an exemplary measured waveform 404. Because of wear and/or mechanical binding the armature may be slow to begin moving. This might show up as a delayed (as compared to the waveform 402) current response. Likewise, when power is removed, wear and/or mechanical binding might cause a different tail-off as compared to the acceptable waveform.

As noted, the waveform differences are used for fault diagnosis. If a electromechanical device 220 under test is mechanically stuck, the current waveform difference might be very large and a fault might be isolated to a particular module or device. Furthermore, smaller waveform differences, such as the time difference 406 between turn-on peaks of the waveform 402 and the waveform 404, might be used to predict future solenoid problems. For example, if the time difference 406 exceeds a predetermined maximum value the central processing unit 306 might inform the field-service operator to replace the solenoid in anticipation of failure.

Figure 5:
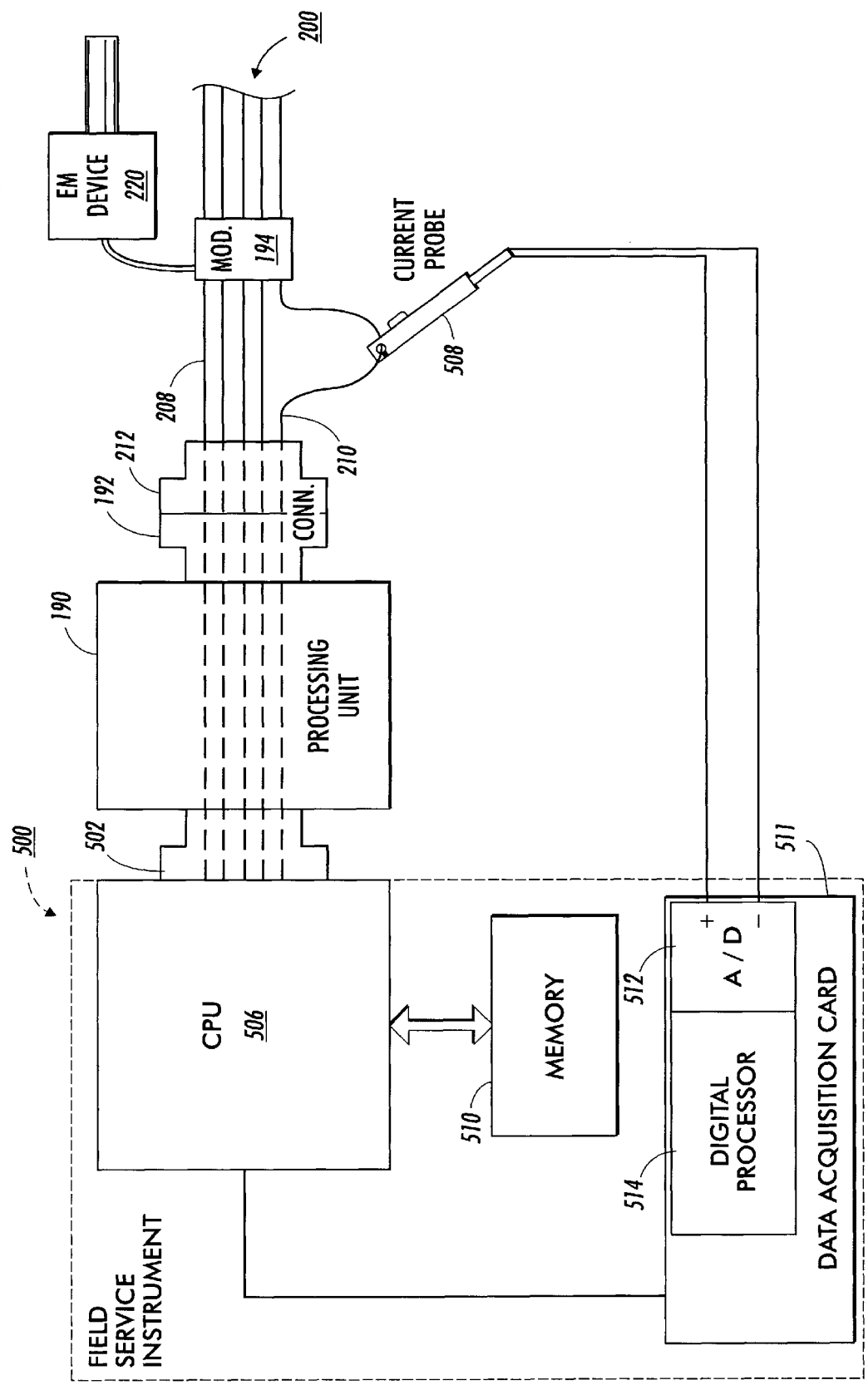
FIG. 5, which illustrates a field-service instrument having a current probe and which is connected to the electrophotographic printing machine of FIG. 1.

FIG. 5 illustrates another analog current signature analysis field service instrument 500 connected to the printing machine 8. The field service instrument 500 connects to the processing unit 190 via a connector 502. That connection might be made directly to the processing unit 190, or by way of another connection to the bus 200. The field-test instrument 500 includes a central processing unit 506. That processing unit sends commands to the processing unit 190, via the bus 200, that causes the processing unit 190 to give control of the module 194 to the central processing unit 506. The field-test instrument 500 includes a current probe 508 that clips on the return line 210. A voltage proportional to the current flow through the return line is applied to a data acquisition card 511. The data acquisition card includes an analog-to-digital converter 512 and a digital processor 514 that connects to the central processing unit 506. Also connected to the central processing unit 506 is a memory card 510.

In operation, as a preprogrammed response to an operator input, the central processing unit 506 send digital information to the module 194 that causes the module to turn on a selected electromechanical device, say the solenoid 220. That device then begins drawing electrical current. That increased electrical current is sensed by the A/D converter 512, which converts the increased current into digital information that is processed and stored by the digital processor unit 514. The processed and stored information is then sent to the central processing unit 506. The central processing unit recalls baseline information from the memory 510 and compares that baseline information to the measurement information from the digital processor unit 514. Based upon that comparison, using preprogrammed criteria, the central processing unit provides a field-service operator with diagnostic information about the electromechanical device being tested (here the solenoid 220). Again, such diagnostic information might take the form of a good-bad alarm, a display that provides both measured and acceptable current traces, or a numerical indication of the quality of the electromechanical device under test.

Additionally, the CPU 506 can be programmed to monitor, not control, the bus 200 activity, logging the digital transactions and analog current signature waveforms, then comparing them to baseline waveforms associated with specific electrophotographic printing machine 8 diagnostic procedures.

It is to be understood that while the figures and the above description illustrate the present invention, they are exemplary only. Others who are skilled in the applicable arts will recognize numerous modifications and adaptations of the illustrated embodiments that will remain within the principles of the present invention. Therefore, the present invention is to be limited only by the appended claims.

What is claimed:

1. A field service instrument for performing current analysis of electromechanical devices, comprising:
    a field-installable bus interface for transmitting digital control signals to a module that applies electrical current to an electromechanical device in response a specific digital control signals;
    a current sensor for monitoring current to said electromechanical device;
    a bus controller connected to said bus interface, said bus controller for applying said specific digital control signals to said module via said field-installable bus interface such that said current sensor monitors current to said electromechanical device;
    an analog-to-digital converter for converting said current to said electromechanical device into a digital form;
    a digital processor for obtaining a digital real time current profile of said digital form;
    a memory for storing a baseline current profile for said electromechanical device; and
    a fault determination network for comparing said digital real time current profile with said baseline current profile, the fault determination network comparing at least one of time-dependent peaks of the digital real time current profile, time-dependent peaks of the baseline current profile, and frequency-dependent peaks of the baseline current profile to determine degradation of the electromechanical device.

2. A field service instrument according to claim 1, wherein said fault determination network uses predetermined criteria in said comparison for determining whether said electromechanical device is acceptable.

3. A field service instrument according to claim 2, wherein said predetermined criteria includes information used in determining degradation of said electromechanical device.

4. A field service instrument according to claim 2, wherein said fault determination network compares time-dependent peaks of said digital real time current profile and said baseline current profile.

5. A field service instrument according to claim 2, wherein said fault determination network compares frequency-dependent peaks of said baseline current profile.

6. A field service instrument according to claim 1, wherein said current sensor is a resistor.

7. A field service instrument according to claim 1, wherein said current sensor is a current probe.

8. A field service instrument according to claim 1, further including a power supply for supply said current to said electromechanical device.

9. A field service instrument according to claim 8, wherein said current for said electromechanical device is sent over said field-installable bus interface.

10. A field service instrument including an electric current sensor connected to an on-board digital processor via an analog-to-digital converter, the on-board digital processor further being connected to an on-board bus interface controlled by an on-board bus controller and selectively connectable to an electromechanical device, the on-board bus interface transmitting digital control signals to the electromechanical device in response to the bus controller and the current sensor monitoring current supplied to the electromechanical device, the analog-to-digital converter providing a digital form of the monitored current to the digital processor, and the digital processor obtaining a real time digital current profile based on the digital form, the instrument further including a fault determination network that compares the digital current profile to a baseline current profile and uses results of the comparison to detect a fault in the electromechanical device, the fault determination network comparing at least one of time-dependent peaks of the digital real time current profile, time-dependent peaks of the baseline current profile, and frequency-dependent peaks of the baseline current profile to determine degradation of the electromechanical device.

11. The field service instrument of claim 10 further including an on-board memory connected to the digital processor and the fault determination network, the baseline current profile being stored in the on-board memory.

12. The field service instrument of claim 10 wherein the fault determination device uses predetermined criteria to obtain the results of the comparison.

13. The field service instrument of claim 12 wherein the predetermined criteria include criteria enabling the fault determination to detect degraded performance of the electromechanical device.

14. The field service instrument of claim 10 wherein the current sensor is a resistor.

15. The field service instrument of claim 10 further including an on-board power supply independent of a power supply of the electromechanical device and capable of supplying current to the electromechanical device for diagnostic purposes.

16. The field service instrument of claim 15 wherein the current from the on-board power supply travels to the electromechanical device through the on-board bus interface.

17. A method of using the field service instrument of claim 10 including the steps of:
    connecting the instrument to the electromechanical device via the on-board bus interface;
    initiating control of the electromechanical device with the instrument;
    monitoring current supplied to the electromechanical device;
    comparing the current supplied to the baseline current profile; and
    noting detection of a fault.

18. The method of claim 17 further including the step of storing data about the fault in a memory of the instrument.

19. The method of claim 18 further including the step of providing a visual display of information relating to the fault.

* * * * *